United States Patent
Böhm et al.

(10) Patent No.: US 6,483,768 B2
(45) Date of Patent: Nov. 19, 2002

(54) CURRENT DRIVER CONFIGURATION FOR MRAM

(75) Inventors: Thomas Böhm, Zorneding (DE); Dietmar Gogl, Fishkill, NY (US); Gerhard Müller, Meitingen; Thomas Röhr, Aschheim, both of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/898,221

(22) Filed: Jul. 3, 2001

(65) Prior Publication Data

US 2002/0024875 A1 Feb. 28, 2002

(30) Foreign Application Priority Data

Jul. 3, 2000 (DE) .......................................... 100 32 272

(51) Int. Cl.[7] .................................................. G11C 8/00
(52) U.S. Cl. ................... 365/230.06; 365/158; 365/173
(58) Field of Search ........................... 365/230.06, 173, 365/158, 171

(56) References Cited

U.S. PATENT DOCUMENTS

| 5,929,636 | A  | * | 7/1999  | Torok et al.  | 365/230.06 |
|-----------|----|---|---------|---------------|------------|
| 6,052,302 | A  |   | 4/2000  | Moyer et al.  |            |
| 6,134,138 | A  | * | 10/2000 | Lu et al.     | 365/158    |
| 6,256,224 | B1 | * | 7/2001  | Perner et al. | 365/173    |

FOREIGN PATENT DOCUMENTS

DE 19936424 A1 5/2000

* cited by examiner

*Primary Examiner*—Huan Hoang
(74) *Attorney, Agent, or Firm*—Laurence A. Greenberg; Werner H. Stemer; Ralph E. Locher

(57) ABSTRACT

A current driver configuration for MRAMs includes word-line drivers and bit-line drivers at respective first ends of word lines and bit lines. The word line drivers and the bit line drivers each include a series circuit formed by an n-channel field-effect transistor and a current source. Further series circuits are provided at the respective second ends of the word lines and the bit lines. Each of the further series circuits includes a second n-channel field-effect transistor and a voltage source.

6 Claims, 2 Drawing Sheets

Prior Art

US 6,483,768 B2

CURRENT DRIVER CONFIGURATION FOR MRAM

BACKGROUND OF THE INVENTION

Field of the Invention

The present invention relates to a current driver configuration for an MRAM (magnetoresistive random access memory) including a memory cell array having a plurality of memory cells at crossover points between word lines and bit lines and including drivers which are assigned to the word lines and the bit lines and are in each case provided at one end of the word lines and the bit lines.

It is known that the magnetically variable electrical resistance of the individual memory cells in MRAMs is utilized for the memory effect. As is shown in FIG. 2, such a memory cell is formed at the crossover between a word line WL, which is assumed to be an upper conductor LTO here, and a bit line BL, which is formed by a lower conductor LTU. At the crossover point between these two conductors LTO and LTU, a specific multilayer system is present between the two conductors LTO and LTU. This multilayer system includes a hard-magnetic material layer HML and a soft-magnetic material layer WML, between which there is a tunnel oxide film TL. In other words, the hard-magnetic material layer HML, the tunnel oxide film TL and the soft-magnetic material layer WML are stacked, one on top of the other, on the lower conductor LTU. The soft-magnetic material layer WML being covered on its top side by the upper conductor LTO.

The configuration of the soft-magnetic material layer WML and hard-magnetic material layer HML can, if appropriate, also be interchanged, with the result that the hard-magnetic material layer HML is provided "at the top", while the soft-magnetic material layer WML is situated on the lower conductor LTU. Equally, it is possible to provide the upper conductor LTO for the bit line BL and the lower conductor LTU for the word line WL.

All that is important is that the tunnel oxide film TL is provided between the soft-magnetic material layer WML and the hard-magnetic material layer HML, these two layers WML and HML respectively being assigned to an upper conductor LTO and a lower conductor LTU. Instead of an oxide, another material can also be used for the tunnel oxide film.

The thickness $d_{TL}$ (cf. FIG. 3) of the tunnel oxide film TL may preferably be in the range from 0.5 to 5 nm. The thickness $d_{WML}$ of the soft-magnetic material layer WML and the thickness $d_{HML}$ of the hard-magnetic material layer HML lie approximately in the range from 1 to 5 nm. In principle, however, thicknesses that deviate therefrom are also permissible.

In this way, the multilayer system including the soft-magnetic material layer WML, the tunnel oxide film TL and the hard-magnetic material layer HML forms a memory cell with a resistor R between the upper conductor LTO and the lower conductor LTU, resulting in the configuration shown diagrammatically in FIG. 4.

The resistance of the multilayer system, that is to say of the memory cell, between the conductors LTO and LTU or between the word line WL and the bit line BL depends, then, on whether the magnetization direction in the two material layers WML and HML runs in a manner oriented parallel or antiparallel with respect to one another. If the magnetization directions in the two material layers WML and HML are oriented parallel to one another, then the resistor R has a low resistance, whereas in the case of an antiparallel orientation of the magnetization of these material layers, a high resistance of the resistor R can be recorded. Since the hard-magnetic material layer HML has a fixed magnetization, the memory cell is written to by switching the soft-magnetic material layer, by applying a corresponding magnetic field to the material layer. This magnetic field is generated by superposition of the two magnetic fields which are formed by a current $I_o$ in the upper conductor LTO and a current $I_u$ in the lower conductor LTU. In other words, by sending corresponding currents $I_o$ and $I_u$ in a specific direction through the conductors LTO and LTU, respectively, it is possible to switch over the magnetization direction in the soft-magnetic material layer WML, with the result that this is oriented parallel or antiparallel with respect to the magnetization direction of the hard-magnetic material layer HML. Antiparallel-oriented magnetizations of the two material layers WML and HML are assumed in the example of FIG. 3, this being indicated by corresponding arrows, so that the resistor R has a high resistance in this case.

When switching the soft-magnetic material layer WML between antiparallel- and parallel-oriented magnetizations with respect to the hard-magnetic material layer HML, and vice versa, it should be noted that the soft-magnetic material of the layer WML has a hysteresis property. The triggering of the switching operation requires the superposition of the magnetic fields which are generated by the currents $I_o$ and $I_u$ in the upper conductor LTO and in the lower conductor LTU, respectively. For a switching operation, it is necessary to reverse the original current direction of the current $I_o$ and of the current $I_u$, respectively.

In a conventional DRAM, the word lines are each connected to the gate terminals of switching transistors, with the result that the capacitances formed by the gate terminals are also applied to the word lines. This means that a voltage for rapidly reversing the charge of the capacitances for each word line has to be provided in each case by a driver. The drivers of DRAMs include n- and p-channel field-effect transistors so that low and high voltages can be switched without any losses. However, in order to obtain the same driver power for a p-channel field-effect transistor as for an n-channel field-effect transistor, due to the lesser charge carrier mobility in a p-channel field-effect transistor, it is necessary to specify for the latter a channel width approximately 2.5 times that for the n-channel field-effect transistor.

A conventional driver for the word lines of a DRAM (dynamic random access memory) or FeRAM (ferroelectric random access memory) having a p-channel field-effect transistor P1 and an n-channel field-effect transistor N0, which are connected in series between a driver voltage DRV and ground and are connected to a read-out terminal RDOUTn by their gate terminals, is shown in FIG. 5. The word line WL is located at the junction point between these two transistors P1 and N0. The channel width wp of the p-channel field-effect transistor P1 is 2.5 times the channel width wn of the n-channel field-effect transistor N0.

In an MRAM, in contrast to a DRAM, a high current of 2.5 to 3 mA is required for writing, but the voltage across the individual memory cells should be as small as possible in order to avoid breakdowns of the tunnel oxide layer. By way of example, if a tunnel oxide layer thickness $d_{TL}$ of 2 nm or less is assumed, then the voltage across the tunnel oxide film should not exceed 0.5 V so that a service life of 10 years can be achieved.

SUMMARY OF THE INVENTION

It is accordingly an object of the invention to provide a current driver configuration which overcomes the abovementioned disadvantages of the heretofore-known current driver configurations of this general type and which can provide small voltages with high currents and which, at the same time, requires only a small area.

With the foregoing and other objects in view there is provided, in accordance with the invention, in combination with an MRAM having a memory cell array with a plurality of memory cells, word lines, and bit lines, the word lines and the bit lines having respective first ends and having respective second ends opposite the respective first ends, the word lines and the bit lines crossing one another at respective crossover points, the memory cells being disposed at the crossover points, a current driver configuration which includes:

drivers assigned to respective ones of the word lines and the bit lines, the drivers being provided at the respective first ends of the word lines and the bit lines;

the drivers each including a first n-channel field-effect transistor and a current source connected in series to the first n-channel field-effect transistor; and series circuits provided at the respective second ends of the word lines and the bit lines such that the series circuits are connected between the respective second ends of the word lines and the bit lines and ground, the series circuits each including a second n-channel field-effect transistor and a voltage source.

With the objects of the invention in view there is also provided, a memory configuration, including:

a word line and a bit line crossing one another at a crossing point, the word line and the bit line each having a first end and a second end opposite the first end;

a magnetoresistive memory cell provided at the crossing point;

a first driver assigned to the word line and provided at the first end of the word line;

a second driver assigned to the bit line and provided at the first end of the bit line;

each of the first driver and the second driver including a first n-channel field-effect transistor and a current source connected in series to the first n-channel field-effect transistor; and a first series circuit connected between the second end of the word line and ground;

a second series circuit connected between the second end of the bit line and ground; and each of the first series circuit and the second series circuit including a second n-channel field-effect transistor and a voltage source.

In other words, the object of the invention is achieved by virtue of the fact that the drivers each include an n-channel field-effect transistor and a current source in series therewith.

With the current driver configuration according to the invention, the desired low voltages with high currents, as are required when writing and reading from MRAMs, can be switched using the n-channel field-effect transistors with normal levels without losses on word lines and bit lines of the MRAM. For the same driver power, these n-channel field-effect transistors require a considerably smaller area in comparison with p-channel field-effect transistors. The area is consequently reduced by approximately a factor of 2.5, which can be attributed to the smaller channel width already mentioned. A further reduction in area is possible if boosted voltages are used for driving the n-channel field-effect transistors, which voltages increase the driver power.

According to a feature of the invention, it is provided that at the other end—opposite to the one end—of the word lines and the bit lines, there is located a series circuit formed by a further n-channel field-effect transistor and a voltage source between the other end and ground. In this case, the voltage source may include a resistor, a transistor diode or a complex circuit.

Other features which are considered as characteristic for the invention are set forth in the appended claims.

Although the invention is illustrated and described herein as embodied in a current driver configuration for an MRAM, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
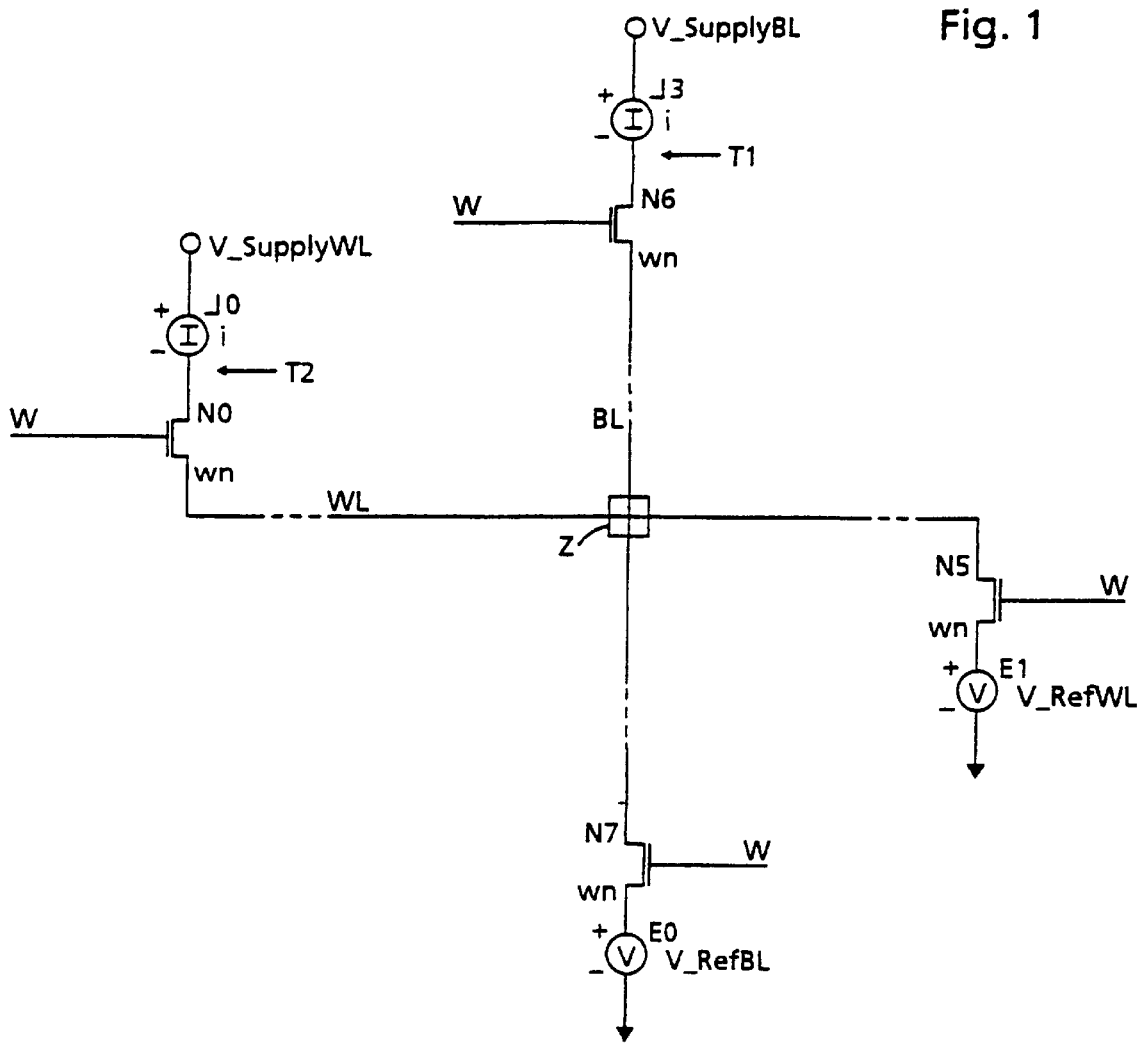
FIG. 1 is a schematic circuit diagram of a current driver configuration for an MRAM according to an exemplary embodiment of the invention.
Figure 2:
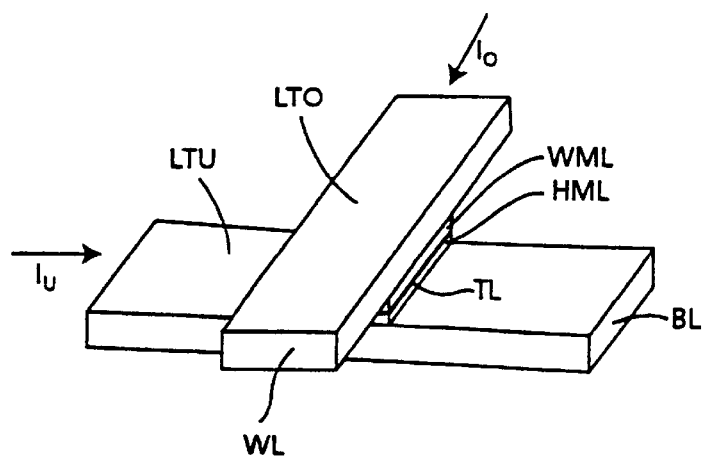
FIG. 2 is a diagrammatic perspective view of a memory cell of an MRAM.
Figure 3:
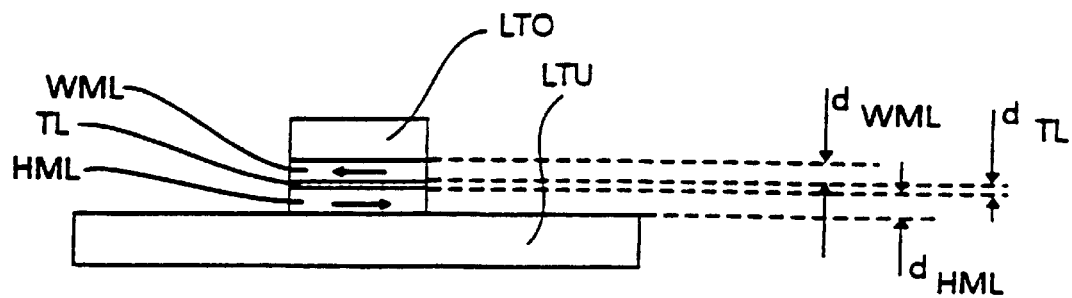
FIG. 3 is a diagrammatic side view of the memory cell shown in FIG. 2.

Referring now to the figures of the drawings in detail, in which the same reference symbols are used for corresponding structural parts, and first, particularly, to FIG. 1 thereof, there is shown a current driver configuration including a driver T1 for a bit line BL and a driver T2 for a word line WL. The driver T1 includes a current source J3 and an n-channel field-effect transistor N6 having the channel width wn, and, in a similar manner, the driver T2 has a current source J0 and an n-channel field-effect transistor N0 having the channel width wn. The current source J3 and the field-effect transistor N6 are connected in series between a supply voltage source V_SupplyBL and the bit line BL, and, in a similar manner, the current source J0 and the field-effect transistor N0 are connected in series between a supply voltage source V_SupplyWL for the word line WL and the word line WL. The gate terminals of the two transistors N6 and N0 can be driven through the use of a signal W in each case.

Figure 4:
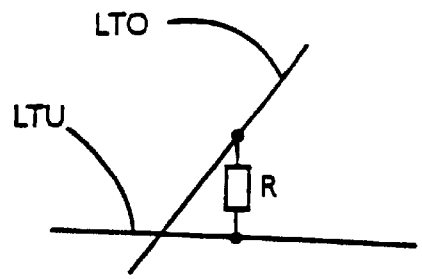
FIG. 4 is a schematic equivalent circuit diagram for the memory cell of FIG. 2 and FIG. 3, respectively.
Figure 5:
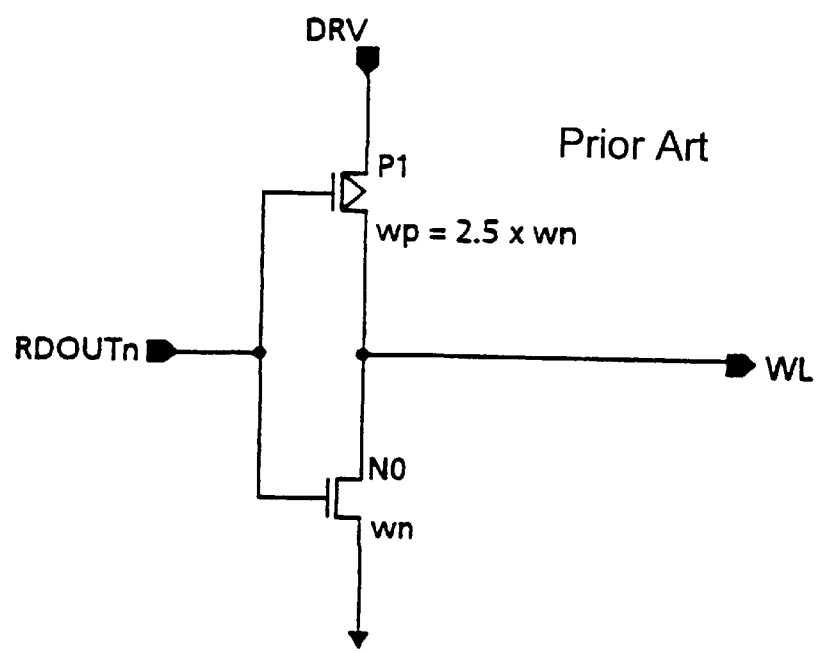
FIG. 5 is a schematic circuit diagram of an existing driver for a DRAM.

At the crossover between the word line WL and the bit line BL there is a memory cell Z, which forms a resistor R (cf. FIG. 4).

A series circuit including an n-channel field-effect transistor N7 and a reference voltage source V_RefBL (E0) is located at that end of the-bit line BL which is opposite to the driver T1. The negative pole (terminal) this voltage source E0 is connected to ground in this case. The field-effect transistor N7 is driven by the signal W at its gate and has a channel width wn like the field-effect transistors N0 and N6.

Furthermore, a series circuit including an n-channel field-effect transistor N5 and a reference voltage source V_RefWL (E1) is provided at that end of the word line WL which is opposite to the driver T2. The negative pole of this voltage source E1 is connected to ground. The field-effect transistor N5 is driven by the signal W at its gate and has a channel width wn.

In order to be able to switch over the current direction in a line, in the general case the current driver can be provided at both ends of the word line WL or bit line BL. In circuitry terms, this requires e.g. simply that the current source J0 be supplemented by a voltage source (e.g. E1) and the voltage source E1 be supplemented by a current source (e.g. J0). The same can also be applied to the bit line BL.

During writing, a write path is opened in the word line WL and in the bit line BL through the use of the signal W. The current flowing in the word line WL from the current source J0 can then flow away to ground via the field-effect transistors N0 and N5 and also the reference voltage source E1. Equally, the current in the bit line BL from the current source J3 can flow away to ground via the field-effect transistors N6 and N7 and also the reference voltage source E0. In the memory cell Z, these currents generate a magnetic field which switches over the magnetization in the soft-magnetic layer WML.

The voltage sources E0 and E1 at the end of the bit line BL and at the end of the word line WL, respectively, serve for generating adjustable reference voltages. These voltage sources can be realized by a resistor, a transistor diode or a complex circuit and keep the bit line BL and the word line WL, respectively, at a specific potential, thereby preventing breakdowns across the memory cells Z.

Boosted voltages can be used for driving the field-effect transistors N0 and/or N6, which allows a reduction in area for the same driver power.

We claim:

1. In combination with an MRAM having a memory cell array with a plurality of memory cells, word lines, and bit lines, the word lines and the bit lines having respective first ends and having respective second ends opposite the respective first ends, the word lines and the bit lines crossing one another at respective crossover points, the memory cells being disposed at the crossover points, a current driver configuration, comprising:

drivers assigned to respective ones of the word lines and the bit lines, said drivers being provided at the respective first ends of the word lines and the bit lines;

said drivers each including a first n-channel field-effect transistor and a current source connected in series to said first n-channel field-effect transistor; and series circuits provided at the respective second ends of the word lines and the bit lines such that said series circuits are connected between the respective second ends of the word lines and the bit lines and ground, said series circuits each including a second n-channel field-effect transistor and a voltage source.

2. The current driver configuration according to claim 1, wherein said voltage source is formed of a resisitor.

3. The current driver configuration according to claim 1, wherein said voltage source is formed of a transistor diode.

4. The current driver configuration according to claim 1, wherein said voltage source is a complex circuit.

5. The current driver configuration according to claim 1, wherein said first n-channel field-effect transistor is configured for being driven with boosted voltages.

6. A memory configuration, comprising:

a word line and a bit line crossing one another at a crossing point, said word line and said bit line each having a first end and a second end opposite said first end;

a magnetoresistive memory cell provided at the crossing point;

a first driver assigned to said word line and provided at said first end of said word line;

a second driver assigned to said bit line and provided at said first end of said bit line;

each of said first driver and said second driver including a first n-channel field-effect transistor and a current source connected in series to said fist n-channel field-effect transistor;

a first series circuit connected between said second end of said word line and ground;

a second series circuit connected between said second end of said bit line and ground; and each of said first series circuit and said second series circuit including a second n-channel field-effect transistor and a voltage source.

* * * * *